US 10,644,080 B2

(12) United States Patent
Guard et al.

(10) Patent No.: US 10,644,080 B2
(45) Date of Patent: May 5, 2020

(54) INTEGRATED TOUCH SCREEN

(71) Applicant: Neodrón Limited, Dublin (IE)

(72) Inventors: David Brent Guard, Fareham (GB); Esat Yilmaz, Santa Cruz, CA (US); Matthew Trend, Fareham (GB)

(73) Assignee: Neodrón Limited, Dublin (IE)

( * ) Notice: Subject to any disclaimer, the term of this patent is extended or adjusted under 35 U.S.C. 154(b) by 0 days.

(21) Appl. No.: 16/266,656

(22) Filed: Feb. 4, 2019

(65) Prior Publication Data

US 2019/0181185 A1    Jun. 13, 2019

Related U.S. Application Data

(63) Continuation of application No. 14/509,525, filed on Oct. 8, 2014, now Pat. No. 10,199,439, which is a
(Continued)

(51) Int. Cl.
| | | |
|---|---|---|
| *G02F 1/1335* | (2006.01) | |
| *H01L 27/32* | (2006.01) | |
| *G06F 3/041* | (2006.01) | |
| *G06F 3/044* | (2006.01) | |
| *G02F 1/1333* | (2006.01) | |
| *G06F 1/16* | (2006.01) | |

(52) U.S. Cl.
CPC ........ *H01L 27/323* (2013.01); *G02F 1/13338* (2013.01); *G06F 1/1652* (2013.01); *G06F 3/044* (2013.01); *G06F 3/0412* (2013.01)

(58) Field of Classification Search
CPC ..... H01L 27/323; G06F 3/0412; G06F 1/1652
See application file for complete search history.

(56) References Cited

U.S. PATENT DOCUMENTS

| | | |
|---|---|---|
| 4,290,061 A | 9/1981 | Serrano |
| 5,122,787 A | 6/1992 | Fujita et al. |
| | (Continued) | |

FOREIGN PATENT DOCUMENTS

| | | |
|---|---|---|
| JP | 2009259063 A | 11/2009 |
| WO | 2012129247 A2 | 9/2012 |

OTHER PUBLICATIONS

U.S. Appl. No. 61/454,936, filed Mar. 21, 2011, Myers.
(Continued)

*Primary Examiner* — Joseph L Williams
(74) *Attorney, Agent, or Firm* — Shami Messinger PLLC

(57) ABSTRACT

An apparatus having a touch-sensitive screen, a touch-sensor controller and a flexible printed circuit. A plurality of first conductive electrodes and a plurality of second conductive electrodes are substantially aligned with one or more gaps between two or more pixels of a two-dimensional array of pixels such that the electrodes do not cross over at least one of the pixels of the two-dimensional array of pixels. The plurality of first conductive electrodes form vertices within the one or more gaps between two or more pixels of the two-dimensional array of pixels such that the vertices do not obscure in plan view at least one of the pixels of the two-dimensional array of pixels. The touch-sensor controller is configured to detect and process the change in capacitance at one or more touch-sensor nodes to determine the presence and location of a touch-sensor input.

20 Claims, 3 Drawing Sheets

Related U.S. Application Data continuation of application No. 14/254,979, filed on Apr. 17, 2014, now Pat. No. 9,608,047, which is a continuation of application No. 13/422,410, filed on Mar. 16, 2012, now Pat. No. 8,711,292.

(60) Provisional application No. 61/563,007, filed on Nov. 22, 2011.

(56) References Cited

U.S. PATENT DOCUMENTS

| | | |
|---|---|---|
| 5,418,551 A | 5/1995 | Ise |
| 5,852,487 A | 12/1998 | Fujimori et al. |
| 6,483,498 B1 | 11/2002 | Colgan et al. |
| 6,501,529 B1 | 12/2002 | Kurihara et al. |
| 6,570,707 B1 | 5/2003 | Murakami et al. |
| 6,812,974 B1 | 11/2004 | Hinata et al. |
| 7,463,246 B2 | 12/2008 | Mackey |
| 7,663,607 B2 | 2/2010 | Hotelling et al. |
| 7,864,503 B2 | 1/2011 | Chang |
| 7,875,814 B2 | 1/2011 | Chen et al. |
| 7,920,129 B2 | 4/2011 | Hotelling et al. |
| 8,031,094 B2 | 10/2011 | Hotelling et al. |
| 8,031,174 B2 | 10/2011 | Hamblin et al. |
| 8,040,326 B2 | 10/2011 | Hotelling et al. |
| 8,049,732 B2 | 11/2011 | Hotelling et al. |
| 8,134,535 B2 | 3/2012 | Choi et al. |
| 8,174,510 B2 | 5/2012 | Polishchuk et al. |
| 8,179,381 B2 | 5/2012 | Frey et al. |
| 8,184,107 B2 | 5/2012 | Lee et al. |
| 8,217,902 B2 | 7/2012 | Chang et al. |
| 8,243,027 B2 | 8/2012 | Hotelling et al. |
| 8,355,006 B2 | 1/2013 | Park et al. |
| 8,456,444 B2 | 6/2013 | Ishizaki et al. |
| 8,519,963 B2 | 8/2013 | Kocienda et al. |
| 8,599,150 B2 | 12/2013 | Philipp |
| 8,711,292 B2 | 4/2014 | Guard et al. |
| 8,723,824 B2 | 5/2014 | Myers et al. |
| 9,122,357 B2 | 9/2015 | Nakanishi et al. |
| 9,158,420 B2 | 10/2015 | Cok |
| 9,262,019 B2 | 2/2016 | Guard et al. |
| 9,400,576 B2 | 7/2016 | Chen et al. |
| 9,442,599 B2 | 9/2016 | Lyle et al. |
| 9,608,047 B2 | 3/2017 | Guard et al. |
| 9,825,104 B2 | 11/2017 | Yilmaz et al. |
| 9,830,029 B2 | 11/2017 | Wang et al. |
| 9,965,106 B2 | 5/2018 | Guard et al. |
| 10,199,439 B2 | 2/2019 | Guard et al. |
| 2002/0167270 A1* | 11/2002 | Siwinski ............... G06F 3/041 313/506 |
| 2003/0159910 A1* | 8/2003 | Caldwell ............... A47B 57/00 200/310 |
| 2005/0280635 A1 | 12/2005 | Hinata |
| 2008/0007533 A1 | 1/2008 | Hotelling |
| 2008/0062148 A1 | 3/2008 | Hotelling et al. |
| 2008/0158178 A1* | 7/2008 | Hotelling ............... G06F 3/044 345/173 |
| 2008/0277259 A1 | 11/2008 | Chang |
| 2008/0284925 A1* | 11/2008 | Han ................... G06F 3/0425 349/12 |
| 2008/0309635 A1 | 12/2008 | Matsuo |
| 2009/0085894 A1 | 4/2009 | Gandhi et al. |
| 2009/0086113 A1 | 4/2009 | Ko et al. |
| 2009/0219258 A1 | 9/2009 | Geaghan et al. |
| 2009/0315854 A1 | 12/2009 | Matsuo |
| 2010/0033781 A1 | 2/2010 | Leister |
| 2010/0045632 A1 | 2/2010 | Yilmaz et al. |
| 2010/0053534 A1 | 3/2010 | Hsieh et al. |
| 2010/0053854 A1 | 3/2010 | Nishikawa et al. |
| 2010/0066650 A1 | 3/2010 | Lee et al. |
| 2010/0214247 A1 | 8/2010 | Tang et al. |
| 2010/0238134 A1 | 9/2010 | Day et al. |
| 2010/0302202 A1 | 12/2010 | Takeuchi et al. |
| 2011/0007011 A1 | 1/2011 | Mozdzyn |
| 2011/0102370 A1 | 5/2011 | Kono et al. |
| 2011/0210935 A1 | 9/2011 | Chuang |
| 2011/0210941 A1 | 9/2011 | Reynolds et al. |
| 2011/0261005 A1 | 10/2011 | Joharapurkar et al. |
| 2011/0267295 A1 | 11/2011 | Noguchi et al. |
| 2011/0267305 A1 | 11/2011 | Shahparnia et al. |
| 2011/0291966 A1 | 12/2011 | Takao et al. |
| 2012/0013565 A1 | 1/2012 | Westhues et al. |
| 2012/0044187 A1 | 2/2012 | Polishchuk et al. |
| 2012/0062469 A1 | 3/2012 | Guard |
| 2012/0062510 A1 | 3/2012 | Mo et al. |
| 2012/0062511 A1 | 3/2012 | Ishizaki et al. |
| 2012/0154699 A1* | 6/2012 | Yu ....................... G09G 3/3648 349/33 |
| 2012/0242588 A1 | 9/2012 | Myers et al. |
| 2012/0242592 A1 | 9/2012 | Rothkopf et al. |
| 2012/0243151 A1 | 9/2012 | Lynch |
| 2012/0243719 A1 | 9/2012 | Franklin et al. |
| 2012/0299865 A1 | 11/2012 | Yu |
| 2013/0076612 A1 | 3/2013 | Myers |
| 2014/0070350 A1 | 3/2014 | Kim et al. |
| 2019/0181185 A1 | 6/2019 | Guard et al. |

OTHER PUBLICATIONS

U.S. Appl. No. 61/454,950, filed Mar. 21, 2011, Lynch.
David B. Guard, U.S. Appl. No. 13/422,410, Notice of Allowance and Fees Due, dated Dec. 11, 2013., 9 Pages.
David B. Guard, U.S. Appl. No. 13/422,410, Request for Continued Examination and Amendment, dated Apr. 2, 2013., 13 Pages.
David B. Guard, U.S. Appl. No. 13/422,410, Requirement for Restriction/Election, dated May 16, 2012., 5 Pages.
David B. Guard, U.S. Appl. No. 13/422,410, Response after Non-final Rejection, dated Aug. 12, 2013., 16 Pages.
David B. Guard, U.S. Appl. No. 13/422,410, Response to After Final Rejection, dated Nov. 25, 2013., 11 pages.
David B. Guard, U.S. Appl. No. 13/422,410, Response to Non-final Rejection, dated Sep. 25, 2012., 12 Pages.
David B. Guard, U.S. Appl. No. 13/422,410, Response to Requirement for Restriction/Election, dated Jun. 11, 2012., 1 Page.
David B. Guard, U.S. Appl. No. 13/350,018, Final Rejection, dated Aug. 28, 2015. 13 Pages.
David B. Guard, U.S. Appl. No. 13/350,018, Non-final Rejection, dated Oct. 29, 2014. 9 Pages.
David B. Guard, U.S. Appl. No. 13/350,018, Non-final Rejection. dated Sep. 8, 2017. 15 Pages.
David B. Guard, U.S. Appl. No. 13/350,018, Notice of Allowance, dated Jan. 11, 2018. 7 Pages.
David Brent Guard, U.S. Appl. No. 16/440,762, Non-final Rejection, dated Jul. 25, 2019, 14 Pages.
Esat Yilmaz, U.S. Appl. No. 13/363,887, Final Rejection, dated Sep. 11, 2014, 15 Pages.
Esat Yilmaz, U.S. Appl. No. 13/363,887, Non-final Rejection, dated Oct. 4, 2013, 20 Pages.
Esat Yilmaz, U.S. Appl. No. 13/363,887, Non-final Rejection, dated Apr. 18, 2014, 14 Pages.
U.S. Appl. No. 61/454,894, filed Mar. 21, 2011, Rothkopf.
U.S. Appl. No. 61/454,950, filed Mar. 21, 2011, Myers.
David B. Guard, U.S. Appl. No. 13/422,410, Applicant Initiated Interview Summary, dated Aug. 13, 2013., 2 Pages.
David B. Guard, U.S. Appl. No. 13/422,410, Final Rejection, dated Nov. 2, 2012., 13 Pages.
David B. Guard, U.S. Appl. No. 13/422,410, Final Rejection, dated Sep. 25, 2013., 16 Pages.
David B. Guard, U.S. Appl. No. 13/422,410, Issue Notification, dated Apr. 9, 2014., 1 Page.
David B. Guard, U.S. Appl. No. 13/422,410, Non-final Rejection, dated Apr. 11, 2013., 12 Pages.
David B. Guard, U.S. Appl. No. 13/422,410, Non-final Rejection, dated Jun. 25, 2012.,11 Pages.
David B. Guard, U.S. Appl. No. 14/254,979, Final Rejection, dated Jul. 1, 2016, 7 pages.
David B. Guard, U.S. Appl. No. 14/254,979, Final Rejection, dated Oct. 7, 2015, 14 pages.

(56) References Cited

OTHER PUBLICATIONS

David B. Guard, U.S. Appl. No. 14/254,979, Non-final Rejection, dated Feb. 4, 2015, 7 pages.
David B. Guard, U.S. Appl. No. 14/254,979, Non-final Rejection, dated May 14, 2015, 13 pages.
David B. Guard, U.S. Appl. No. 14/254,979, Notice of Allowance, dated Nov. 23, 2016, 11 pages.
David B. Guard, U.S. Appl. No. 14/509,425, Non-Final Rejection, dated Feb. 24, 2017, 13 pages.
David B. Guard, U.S. Appl. No. 14/509,425, Non-Final Rejection, dated May 31, 2018, 5 pages.
David B. Guard, U.S. Appl. No. 14/509,425, Non-Final Rejection, dated Sep. 8, 2017, 10 pages.
David B. Guard, U.S. Appl. No. 14/509,425, Notice of Allowance, dated Oct. 3, 2018, 8 pages.
David B. Guard, U.S. Appl. No. 16/440,762, Notice of Allowance, dated Oct. 17, 2019, 9 pages.
*Neodron Ltd.* v. *Samsung Electronics Co., Ltd. et al* TXWD-6-19-cv-00400, Amended Complaint for Patent Infringement Against Samsung Electronics Co., Ltd. and Samsung Electronics America, Inc., Aug. 30, 2019, 18 pages.
*Neodron Ltd.* v. *Samsung Electronics Co., Ltd. et al* TXWD-6-19-cv-00400, Complaint for Patent Infringement Against Samsung Electronics Co., Ltd. and Samsung Electronics America, Inc. Jun. 28, 2019, 12 pages.
*Neodron Ltd.* v. *Samsung Electronics Co., Ltd. et al.* TXWD-1-19-cv-00903, Order Consolidating Cases, Dec. 20, 2019, 1 page.
*Samsung Electronics Co., Ltd. and Samsung Electronics America, Inc.*, Petitioners v. *Neodron Ltd*, Patent Owner, Curriculum Vitae of Dr. Andrew Wolfe, Exhibit 1003, PTAB-IPR2020-00334, Dec. 20, 2019, 7 pages.
*Samsung Electronics Co., Ltd. and Samsung Electronics America, Inc.*, Petitioners v. *Neodron Ltd*, Patent Owner, Declaration of Dr. Andrew Wolfe, Exhibit 1002, PTAB-IPR2020-00334, Dec. 20, 2019, 96 pages.
*Samsung Electronics Co., Ltd. and Samsung Electronics America, Inc.*, Petitioners v. *Neodron Ltd*, Patent Owner, Petition for Inter Partes Review of U.S. Pat. No. 9,965,106, PTAB-IPR2020-00334, Dec. 20, 2019, 89 pages.

\* cited by examiner

INTEGRATED TOUCH SCREEN

RELATED APPLICATION

This application is a continuation of U.S. patent application Ser. No. 14/509,525, filed Oct. 8, 2014, now U.S. Pat. No. 10,199,439, which is a continuation of U.S. patent application Ser. No. 14/254,979, filed Apr. 17, 2014, now U.S. Pat. No. 9,608,047, which is a continuation of U.S. patent application Ser. No. 13/422,410, filed Mar. 16, 2012, now U.S. Pat. No. 8,711,292, which claims the benefit under 35 U.S.C. § 119(e) of U.S. Provisional Patent Application No. 61/563,007, filed Nov. 22, 2011, all of which are incorporated herein by reference.

TECHNICAL FIELD

This disclosure generally relates to touch screens.

BACKGROUND

A touch sensor may detect the presence and location of a touch or the proximity of an object (such as a user's finger or a stylus) within a touch-sensitive area of the touch sensor overlaid on a display screen, for example. In a touch-sensitive-display application, the touch sensor may enable a user to interact directly with what is displayed on the screen, rather than indirectly with a mouse or touch pad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

A display screen includes a number of layers that form a display stack. The layers of the display stack enable the display screen to produce a color image. The number and type of layers depends on the type of display screen. For example, a Liquid Crystal Display (LCD) based display screen has different layers than an Organic Light Emitting Diode (OLED) based display screen. To form a touch screen, a touch sensor is typically placed over the display stack. For example, the touch sensor may be formed on a transparent cover. The transparent cover, with the touch sensor, is then placed over an already formed display stack. This arrangement negatively impacts the contrast ratio of the display screen. For example, there is typically an air gap between the display stack and the sensor which can create undesirable reflections.

DESCRIPTION OF EXAMPLE EMBODIMENTS

Figure 1:
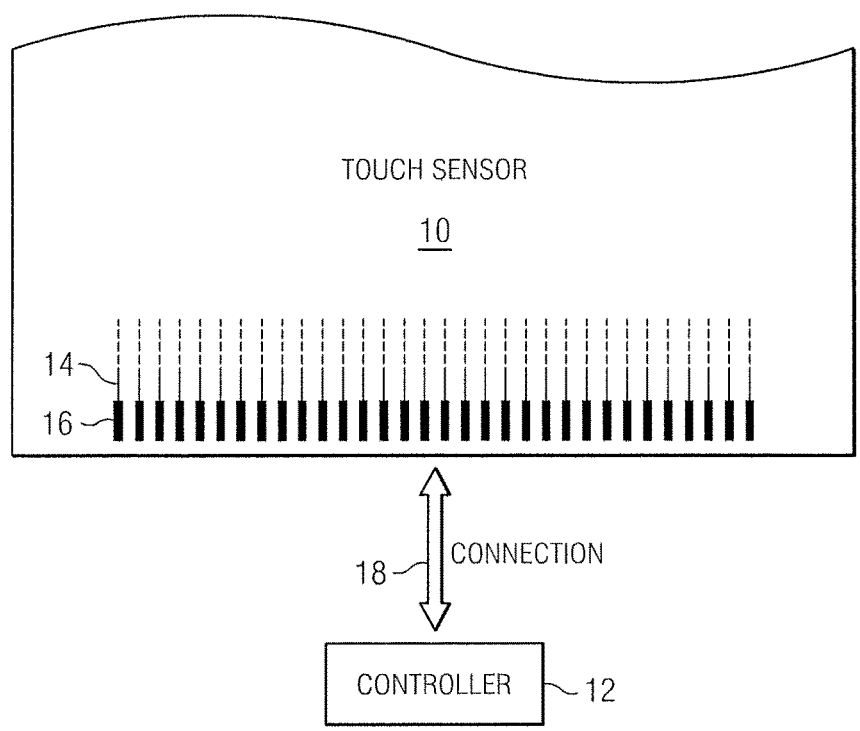
FIG. 1 illustrates an example touch sensor with an example controller.

FIG. 1 illustrates an example touch sensor 10 with an example touch-sensor controller 12. Touch sensor 10 and touch-sensor controller 12 may detect the presence and location of a touch or the proximity of an object within a touch-sensitive area of touch sensor 10. Herein, reference to a touch sensor may encompass both the touch sensor and its touch-sensor controller, where appropriate. Similarly, reference to a touch-sensor controller may encompass both the touch-sensor controller and its touch sensor, where appropriate. Touch sensor 10 may include one or more touch-sensitive areas, where appropriate. Touch sensor 10 may include an array of drive and sense electrodes (or an array of electrodes of a single type) disposed on one or more substrates, which may be made of a dielectric material and/or may be included in a display stack. Herein, reference to a touch sensor may encompass both the electrodes of the touch sensor and the substrate(s) that they are disposed on, where appropriate. Alternatively, where appropriate, reference to a touch sensor may encompass the electrodes of the touch sensor, but not the substrate(s) that they are disposed on.

An electrode (whether a drive electrode or a sense electrode) may be an area of conductive material forming a shape, such as for example a disc, square, rectangle, thin line, other suitable shape, or suitable combination of these. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of indium tin oxide (ITO) and the ITO of the electrode may occupy approximately 100% of the area of its shape (sometimes referred to as 100% fill), where appropriate. In particular embodiments, the conductive material of an electrode may occupy substantially less than 100% of the area of its shape. As an example and not by way of limitation, an electrode may be made of fine lines of metal or other conductive material (FLM) such as for example copper, silver, or a copper- or silver-based material and the fine lines of conductive material may occupy approximately 5% of the area of its shape in a hatched, mesh, or other suitable pattern. Herein, reference to FLM encompasses such material, where appropriate. Although this disclosure describes or illustrates particular electrodes made of particular conductive material forming particular shapes with particular fills having particular patterns, this disclosure contemplates any suitable electrodes made of any suitable conductive material forming any suitable shapes with any suitable fill percentages having any suitable patterns.

Where appropriate, the shapes of the electrodes (or other elements) of a touch sensor may constitute in whole or in part one or more macro-features of the touch sensor. One or more characteristics of the implementation of those shapes (such as, for example, the conductive materials, fills, or patterns within the shapes) may constitute in whole or in part one or more micro-features of the touch sensor. One or more macro-features of a touch sensor may determine one or more characteristics of its functionality, and one or more micro-features of the touch sensor may determine one or more optical features of the touch sensor, such as transmittance, refraction, or reflection.

A mechanical stack may contain the substrate (or multiple substrates) and the conductive material forming the drive or sense electrodes of touch sensor 10. In some embodiments, the mechanical stack may be within or comprise a display stack configured to generate images. As an example and not by way of limitation, the mechanical stack may include a first layer of optically clear adhesive (OCA) beneath a cover panel of a display stack. The cover panel may be clear and made of a resilient material suitable for repeated touching, such as for example glass, polycarbonate, or poly(methyl methacrylate) (PMMA). This disclosure contemplates any suitable cover panel made of any suitable material. The first layer of OCA may be disposed between a layer or substrate of the display stack and the substrate with the conductive material forming the drive or sense electrodes. The substrate with the conductive material may provide a benefit or feature in producing an image (e.g., it may be a layer or substrate found in a typical, non-touch, display stack) or it may be a layer added specifically to provide a substrate on which the electrodes are formed. In some embodiments, the mechanical stack may also include a second layer of OCA. In some embodiments, the mechanical stack may also include a dielectric layer (which may be made of polyethylene terephthalate (PET) or another suitable material, similar to the substrate with the conductive material forming the drive or sense electrodes). As an alternative, where appropriate, a thin coating of a dielectric material may be applied instead of the second layer of OCA and/or the dielectric layer. The second layer of OCA may be disposed between the substrate with the conductive material making up the drive or sense electrodes and the dielectric layer, and the dielectric layer may be disposed between the second layer of OCA and another layer of the display stack. As an example only and not by way of limitation, the cover panel may have a thickness of approximately 1 mm; the first layer of OCA may have a thickness of approximately 0.05 mm; the substrate with the conductive material forming the drive or sense electrodes may have a thickness of approximately 0.05 mm; the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses.

In particular embodiments, the drive or sense electrodes in touch sensor 10 may be made of ITO in whole or in part. In particular embodiments, the drive or sense electrodes in touch sensor 10 may be made of fine lines of metal or other conductive material. As an example and not by way of limitation, one or more portions of the conductive material may be copper or copper-based and have a thickness of approximately 5 µm or less and a width of approximately 10 µm or less. As another example, one or more portions of the conductive material may be silver or silver-based and similarly have a thickness of approximately 5 µm or less and a width of approximately 10 µm or less. This disclosure contemplates any suitable electrodes made of any suitable material.

Touch sensor 10 may implement a capacitive form of touch sensing. In a mutual-capacitance implementation, touch sensor 10 may include an array of drive and sense electrodes forming an array of capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by touch-sensor controller 12) may induce a charge on the sense electrode, and the amount of charge induced may be susceptible to external influence (such as a touch or the proximity of an object). When an object touches or comes within proximity of the capacitive node, a change in capacitance may occur at the capacitive node and touch-sensor controller 12 may measure the change in capacitance. By measuring changes in capacitance throughout the array, touch-sensor controller 12 may determine the position of the touch or proximity within the touch-sensitive area(s) of touch sensor 10.

In a self-capacitance implementation, touch sensor 10 may include an array of electrodes of a single type that may each form a capacitive node. When an object touches or comes within proximity of the capacitive node, a change in self-capacitance may occur at the capacitive node and touch-sensor controller 12 may measure the change in capacitance, for example, as a change in the amount of charge needed to raise the voltage at the capacitive node by a pre-determined amount. As with a mutual-capacitance implementation, by measuring changes in capacitance throughout the array, touch-sensor controller 12 may determine the position of the touch or proximity within the touch-sensitive area(s) of touch sensor 10. This disclosure contemplates any suitable form of capacitive touch sensing, where appropriate.

In particular embodiments, one or more drive electrodes may together form a drive line running horizontally or vertically or in any suitable orientation. Similarly, one or more sense electrodes may together form a sense line running horizontally or vertically or in any suitable orientation. In particular embodiments, drive lines may run substantially perpendicular to sense lines. Herein, reference to a drive line may encompass one or more drive electrodes making up the drive line, and vice versa, where appropriate. Similarly, reference to a sense line may encompass one or more sense electrodes making up the sense line, and vice versa, where appropriate.

Touch sensor 10 may have drive and sense electrodes disposed in a pattern on one side of a single substrate. In such a configuration, a pair of drive and sense electrodes capacitively coupled to each other across a space between them may form a capacitive node. For a self-capacitance implementation, electrodes of only a single type may be disposed in a pattern on a single substrate. In addition or as an alternative to having drive and sense electrodes disposed in a pattern on one side of a single substrate, touch sensor 10 may have drive electrodes disposed in a pattern on one side of a substrate and sense electrodes disposed in a pattern on another side of the substrate. Moreover, touch sensor 10 may have drive electrodes disposed in a pattern on one side of one substrate and sense electrodes disposed in a pattern on one side of another substrate. In such configurations, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other—instead they are capacitively coupled to each other across a dielectric at the intersection. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

As described above, a change in capacitance at a capacitive node of touch sensor 10 may indicate a touch or proximity input at the position of the capacitive node. Touch-sensor controller 12 may detect and process the change in capacitance to determine the presence and location of the touch or proximity input. Touch-sensor controller 12 may then communicate information about the touch or proximity input to one or more other components (such one or more central processing units (CPUs)) of a device that includes touch sensor 10 and touch-sensor controller 12, which may respond to the touch or proximity input by initiating a function of the device (or an application running on the device) associated with it. Although this disclosure describes a particular touch-sensor controller having particular functionality with respect to a particular device and a particular touch sensor, this disclosure contemplates any suitable touch-sensor controller having any suitable functionality with respect to any suitable device and any suitable touch sensor.

Touch-sensor controller 12 may be one or more integrated circuits (ICs), such as for example general-purpose microprocessors, microcontrollers, programmable logic devices or arrays, or application-specific ICs (ASICs). In particular embodiments, touch-sensor controller 12 comprises analog circuitry, digital logic, and digital non-volatile memory. In particular embodiments, touch-sensor controller 12 is disposed on a flexible printed circuit (FPC) bonded to the substrate of touch sensor 10. The FPC may be active or passive, where appropriate. In particular embodiments, multiple touch-sensor controllers 12 are disposed on the FPC. Touch-sensor controller 12 may include a processor unit, a drive unit, a sense unit, and a storage unit. The drive unit may supply drive signals to the drive electrodes of touch sensor 10. The sense unit may sense charge at the capacitive nodes of touch sensor 10 and provide measurement signals to the processor unit representing capacitances at the capacitive nodes. The processor unit may control the supply of drive signals to the drive electrodes by the drive unit and process measurement signals from the sense unit to detect and process the presence and location of a touch or proximity input within the touch-sensitive area(s) of touch sensor 10. The processor unit may also track changes in the position of a touch or proximity input within the touch-sensitive area(s) of touch sensor 10. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular touch-sensor controller having a particular implementation with particular components, this disclosure contemplates any suitable touch-sensor controller having any suitable implementation with any suitable components.

Tracks 14 of conductive material disposed on the substrate of touch sensor 10 may couple the drive or sense electrodes of touch sensor 10 to connection pads 16, also disposed on the substrate of touch sensor 10. As described below, connection pads 16 facilitate coupling of tracks 14 to touch-sensor controller 12. Tracks 14 may extend into or around (e.g. at the edges of) the touch-sensitive area(s) of touch sensor 10. Particular tracks 14 may provide drive connections for coupling touch-sensor controller 12 to drive electrodes of touch sensor 10, through which the drive unit of touch-sensor controller 12 may supply drive signals to the drive electrodes. Other tracks 14 may provide sense connections for coupling touch-sensor controller 12 to sense electrodes of touch sensor 10, through which the sense unit of touch-sensor controller 12 may sense charge at the capacitive nodes of touch sensor 10. Tracks 14 may be made of fine lines of metal or other conductive material. As an example and not by way of limitation, the conductive material of tracks 14 may be copper or copper-based and have a width of approximately 100 μm or less. As another example, the conductive material of tracks 14 may be silver or silver-based and have a width of approximately 100 μm or less. In particular embodiments, tracks 14 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 14, touch sensor 10 may include one or more ground lines terminating at a ground connector (which may be a connection pad 16) at an edge of the substrate of touch sensor 10 (similar to tracks 14).

Connection pads 16 may be located along one or more edges of the substrate, outside the touch-sensitive area(s) of touch sensor 10. As described above, touch-sensor controller 12 may be on an FPC. Connection pads 16 may be made of the same material as tracks 14 and may be bonded to the FPC using an anisotropic conductive film (ACF). Connection 18 may include conductive lines on the FPC coupling touch-sensor controller 12 to connection pads 16, in turn coupling touch-sensor controller 12 to tracks 14 and to the drive or sense electrodes of touch sensor 10. This disclosure contemplates any suitable connection 18 between touch-sensor controller 12 and touch sensor 10.

Figure 2:
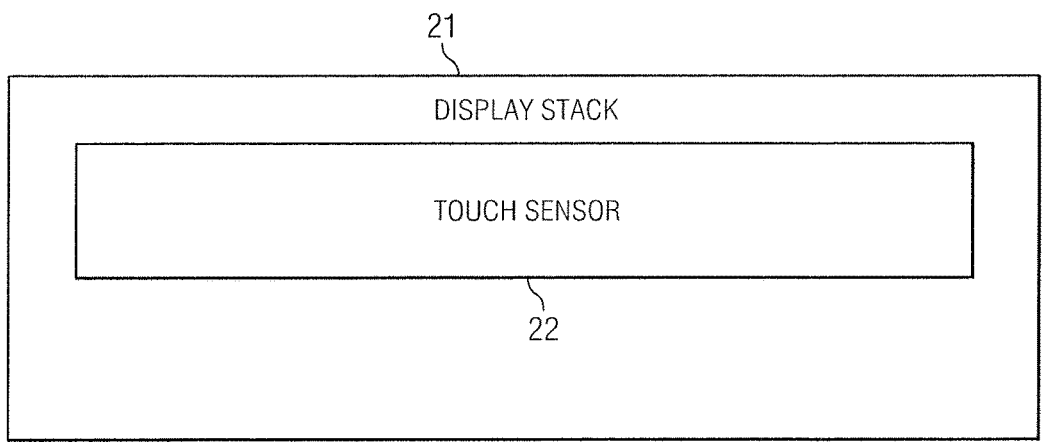
FIG. 2 illustrates a block diagram of a touch sensor provided within a display stack.

FIG. 2 illustrates a block diagram of touch sensor 22 provided within display stack 21, in accordance with particular embodiments. Display stack 21 may comprise a plurality of layers configured to generate a color image. The type and number of layers within display stack 21 may vary depending on the type of display stack and/or the intended application of the display stack. For example, an LCD based display stack 21 may include two or more polarizers while an OLED based display stack may include only one, or no, polarizers. Each layer may comprise a particular feature or characteristic used in a display stack for generating an image. These layers may in some embodiments, be configured to provide a color image. Particular embodiments contemplate display stack 21 comprising any number and/or type of layers for any type of display. In some embodiments, display stack 21 may be a flexible display stack. In some embodiments, display stack 21 may comprise a curved surface (as opposed to the straight surface depicted in FIGS. 3 through 6).

One or more components of touch sensor 22 may be integrated into display stack 21 in any of a variety of different ways, depending on operational needs or the particular embodiment. Touch sensor 22 may be located in any of a variety of different locations within display stack 21. The location of touch sensor 22 may vary depending on the type of display stack 21 (e.g., an LCD display, OLED display, etc.). For example, in an LCD display in which display stack 21 includes one or more polarizers, touch sensor 22 may be positioned within display stack 21 so as to not alter the polarization of the light before it passes through one or more of the polarizers. For example in an LCD display stack 21, if touch sensor 22 includes a substrate made of a birefringent material, then touch sensor 22 may be positioned above any polarizers within display stack 21. If touch sensor 22 includes a substrate made of a non-birefringent material, touch sensor 22 may be positioned between the polarizers of display stack 21. As another example, in an OLED display stack 21, it may not matter whether or not touch sensor 22 uses a birefringent material. This may allow touch sensor 22 to be positioned within any appropriate location within display stack 21. As yet another example, in some embodiments touch sensor 22 may use an existing layer (e.g., a layer found in a typical non-touch display stack, such as the color filter layer or one of the polarizer layers, etc.) of display stack 21 as its substrate.

Touch sensor 22 may be similar to, and comprise similar components and functionality, as touch sensor 10 described above with respect to FIG. 1. Depending on the embodiment, and/or operational needs, touch sensor 22 may be a laminated layer within display stack 21, or one or more of the components of touch sensor 22 (e.g., fine line metal electrodes for sensing a touch input) may be deposited on an existing layer of display stack 21. This may allow the touch sensing functionality to be included during the manufacturing of display stack 21. In embodiments in which touch sensor 22 is deposited on an existing layer of display stack 21, the existing layer of display stack 21 may function as the substrate for touch sensor 22. In other embodiments, touch sensor 22 may comprise its own substrate that is placed within display stack 21. Depending on the type of display and/or the desired location of touch sensor 22 within display stack, the substrate used for touch sensor 21 may be made of a birefringent material or a non-birefringent material. In certain embodiments, having touch sensor 22 within display stack 21 allows for a display stack with touch sensing capability that is substantially free of any air gaps between touch sensor 22 and display stack 21. As such, in certain embodiments, having touch sensor 22 within display stack 21 allows for a display stack with touch sensing capability that is thinner than a traditional display stack with a touch sensor added on top of the display stack.

FIGS. 3 through 6 depict various embodiments illustrating different locations of the electrodes of a touch sensor within a display stack, different types of touch sensors, and different types of display stacks. The illustrated embodiments are not intended to be exhaustive of all possible combinations. For example, one embodiment that may be within the scope of the claims but is not depicted may comprise a double sided sensor in which electrodes are deposited on either side of a color filter of an OLED. Other configurations and embodiments are within the scope of the appended claims and are contemplated by the inventors.

Figure 3:
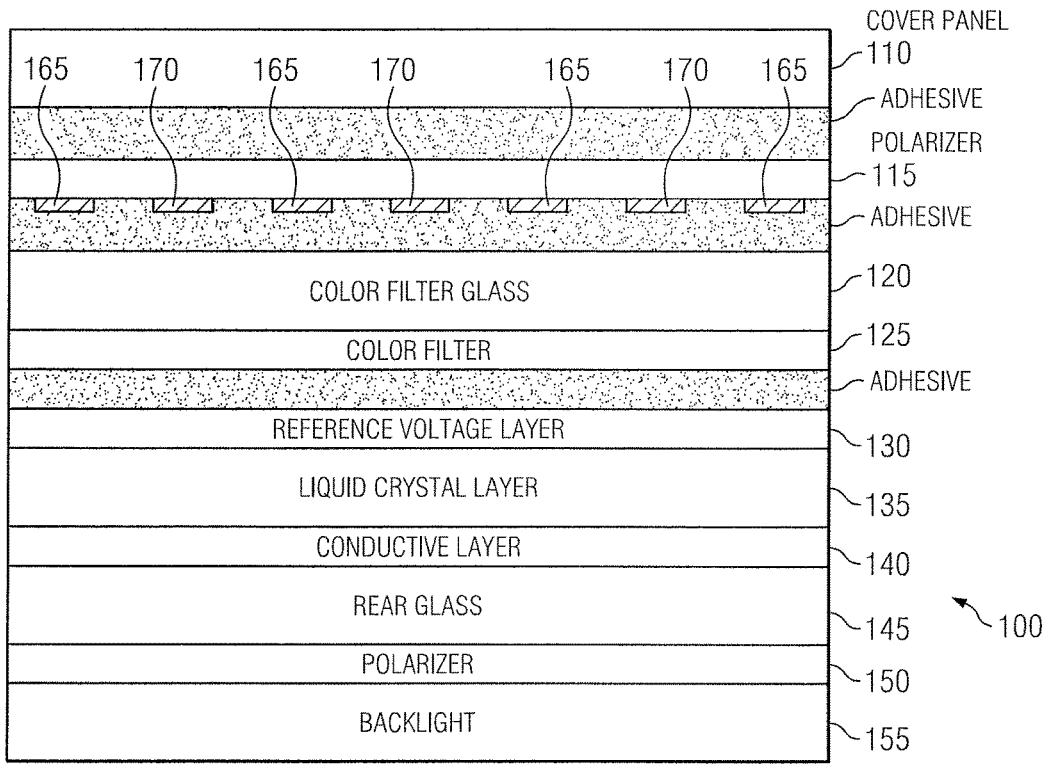
FIG. 3 illustrates a single sided touch sensor in which the electrodes are located on the bottom surface of a polarizer of an LCD display stack.

FIG. 3 illustrates a single-sided touch sensor in which the electrodes are located on the bottom surface of a polarizer of an LCD display stack, in accordance with particular embodiments. Display stack 100 includes cover panel 110, polarizer 115, color filter glass 120, color filter 125, reference voltage layer 130, liquid crystal 135, conductive layer 140, rear glass 145, polarizer 150, backlight source 155, sense electrodes 165, and drive electrodes 170. One or more adhesive layers (e.g., OCA) may be used in display stack 100 to bind layers to one another. The depicted embodiment illustrates some adhesive layers, but not necessarily all, adhesive layers. The depicted layers may cumulatively form a display stack of a display screen with integrated touch functionality.

Cover panel 110 may be a transparent surface designed to withstand repeated touching from a user. In some embodiments, cover panel 110 may be similar to the top layer of a typical display stack or a typical touch screen. In the depicted embodiment, cover panel 110 is part of the display stack of the touch screen. This is in contrast to a typical touch screen in which the cover panel is separate from the display stack and there is a small air gap between the cover panel and the display stack. In the depicted embodiment, cover panel 110 may be clear and made of a resilient material suitable for repeated touching, such as for example glass, polycarbonate, or poly(methyl methacrylate) (PMMA). This disclosure contemplates any suitable cover panel made of any suitable material.

In the depicted embodiment, sense and drive electrodes 165 and 170 are used to determine the position of a touch input on the touch screen. The touch input may be received from any of a variety of sources including, but not limited to, one or more fingers or a stylus. In the depicted embodiment, both electrodes 165 and 170 are located on the same side of polarizer 115. In the depicted embodiment, sense electrodes 165 and drive electrodes 170 are deposited on the bottom surface of polarizer 115. In some embodiments, sense electrodes 165 and drive electrodes 170 may comprise fine lines of metal deposited on polarizer 115. In the depicted embodiments, polarizer 115 acts as a substrate for the touch sensor, including sense electrode 165 and drive electrode 170. This may reduce the overall thickness of a touch screen using display stack 100 by removing the use of a separate substrate specifically for the sense electrodes 165 and drive electrodes 170. Using an existing layer (e.g., polarizer 115) of display stack 100 may improve image quality by reducing the number of layers light has to travel through. In some embodiments, sense electrodes 165 and drive electrodes 170 may be deposited on a separate touch sensor substrate (not depicted) that is added within display stack 100. In some embodiments, sense electrodes 165 and drive electrodes 170 and the touch substrate may be laminated on top of polarizer 115. If the sense electrodes 165 and drive electrodes 170 are positioned above polarizer 115, it may not be necessary to use a non-birefringent material for the touch sensor substrate. An adhesive layer may provide adhesion for layers added on top of sense electrodes 165 and drive electrodes 170.

Figure 4:
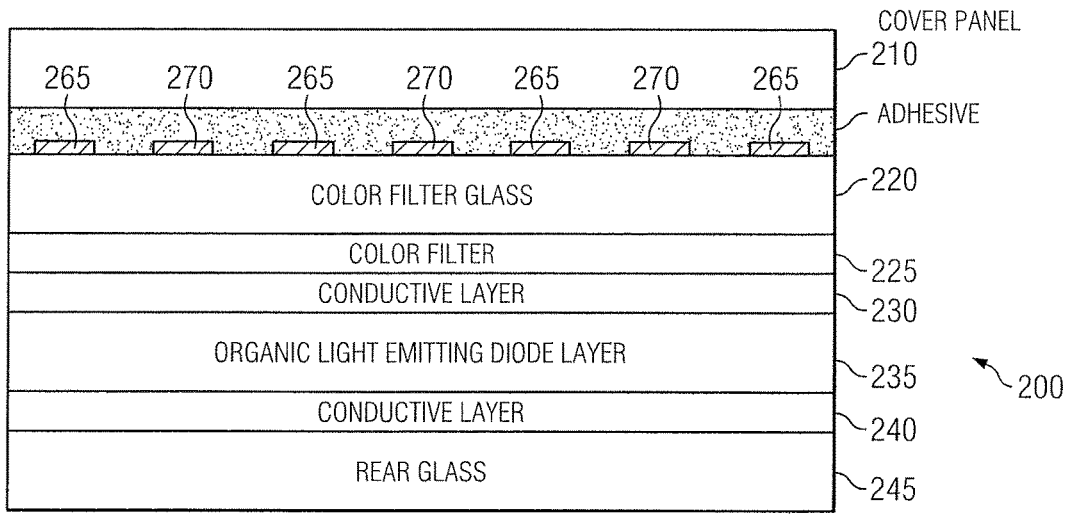
FIG. 4 illustrates a single sided touch sensor in which the electrodes are located on the top surface of a glass layer of an OLED display stack.

FIG. 4 illustrates a single-sided touch sensor in which the electrodes are located on the top surface of a glass layer of an OLED display stack, in accordance with particular embodiments. OLED display stack 200 includes cover panel 210, color filter glass 220, color filter 225, conductive layer 230, organic light emitting diode (OLED) layer 235, conductive layer 240, and rear glass 245. One or more adhesive layers (e.g., OCA) may be used in display stack 100 to bind layers to one another. The depicted embodiment illustrates some adhesive layers, but not necessarily all, adhesive layers. In the depicted embodiment, sense electrodes 265 and drive electrodes 270 are both located along the top surface of color filter glass 220. They may be deposited or laminated thereon.

In some embodiments, sense electrodes 265 and drive electrodes 270 may be located on a touch sensor substrate (not depicted) added to display stack 200. Because display stack 200 is an OLED, the material used for the touch sensor, (e.g., non-birefringent or birefringent) may be of less importance than with an LCD. That is, any polarizing effect of the added touch sensor substrate may not negatively impact the non-polarized light coming from OLED 235. Depending on the embodiment or configuration of the OLED display device, display stack 200 may be flexible or rigid. In addition, display stack 200 may be straight (as depicted) or curved. In some embodiments, sense electrodes 265 and drive electrodes 270 may comprise fine line metal. In other embodiments, sense electrodes 265 and drive electrodes 270 may be formed from indium tin oxide (ITO).

Figure 5:
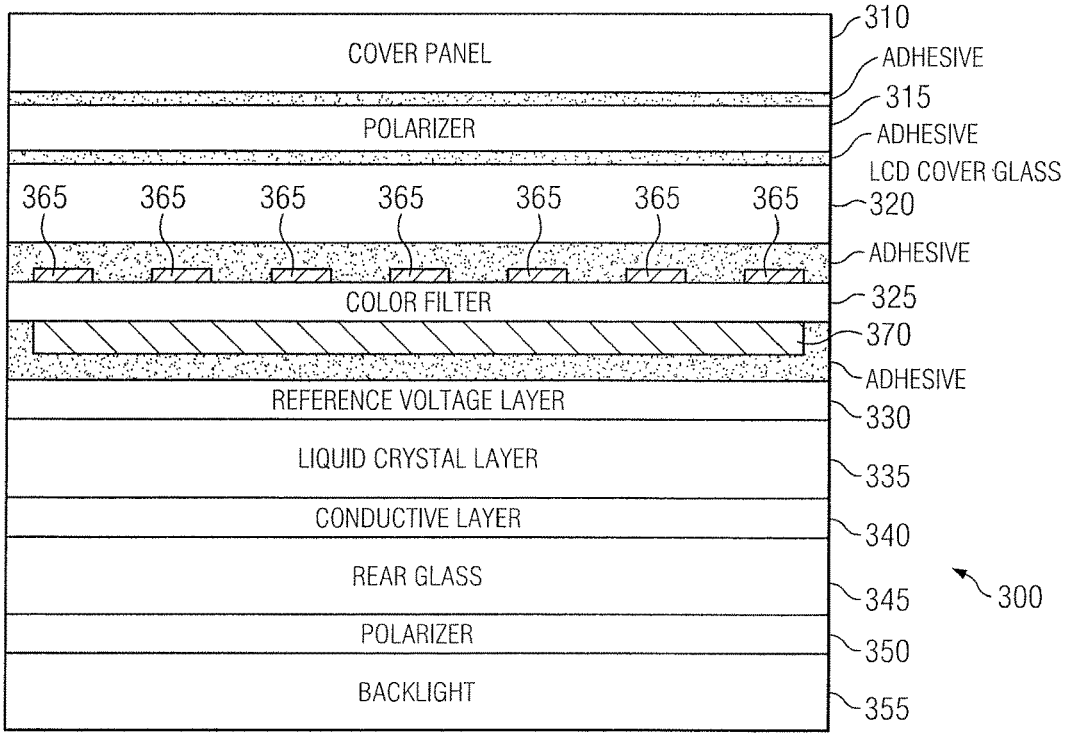
FIG. 5 illustrates a double sided touch sensor in which the electrodes are located on a top and bottom surface of a color filter layer of an LCD display stack.

FIG. 5 illustrates a double-sided touch sensor in which the electrodes are located on a top and bottom surface of a color filter layer of an LCD display stack, in accordance with particular embodiments. Display stack 300 includes cover panel 310, polarizer 315, LCD cover glass 320, color filter 325, reference voltage layer 330, liquid crystal 335, conductive layer 340, rear glass 345, polarizer 350, backlight source 355, sense electrodes 365, and drive electrodes 370. One or more adhesive layers (e.g., OCA) may be used in display stack 100 to bind layers to one another. The depicted embodiment illustrates some adhesive layers, but not necessarily all adhesive layers. In the depicted embodiment, sense electrodes are located on a top surface of color filter 325 and drive electrode 370 is located on a bottom surface of color filter 325. As can be seen in FIG. 5, sense electrodes 365 and drive electrode 370 are located on either side of an existing layer (color filter 325) of display stack 300. In the depicted embodiment color filter 325 acts as a substrate for sense electrodes 365 and drive electrodes 370. Depending on the topology of display stack 300, sense electrodes 365 and drive electrode 370 may be deposited on color filter layer 325. Because sense electrodes 365 and drive electrode 370 are located on an existing layer of display stack 300, the resulting touch functionality of display stack 300 may be thinner than a traditional LCD touch screen.

Figure 6:
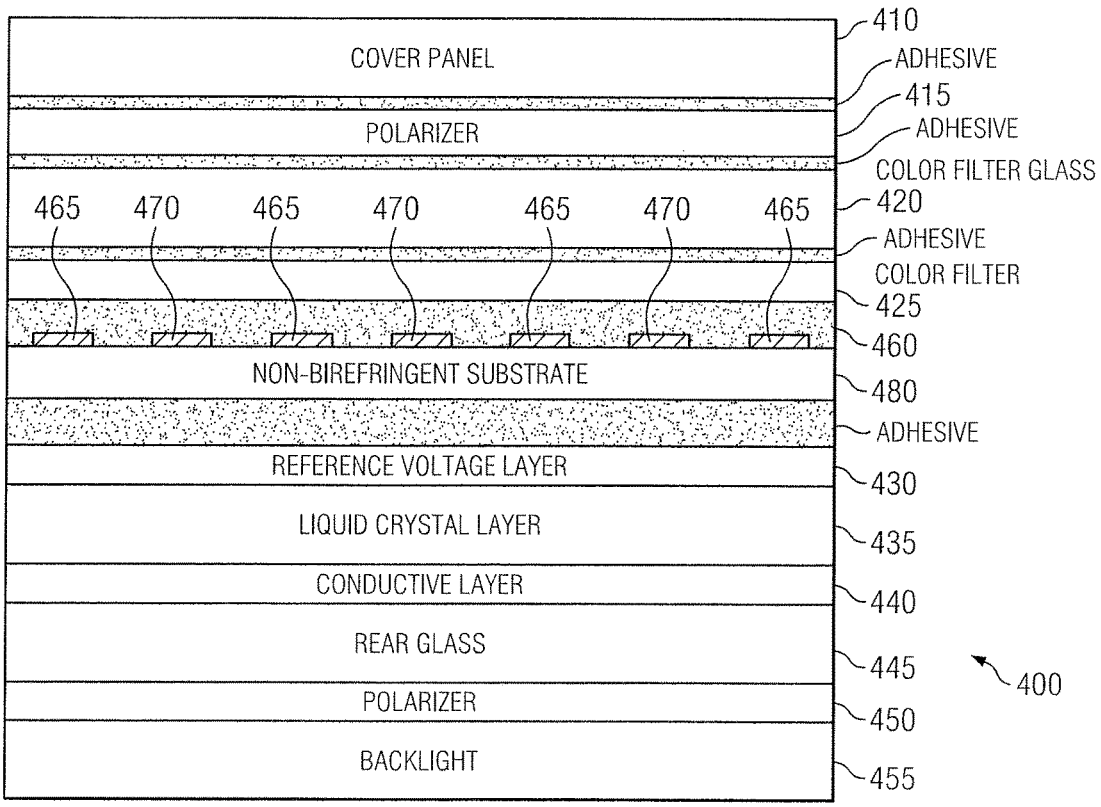
FIG. 6 illustrates a single sided touch sensor in which the electrodes are located on a non-birefringent layer below the polarizer of an LCD display stack.

FIG. 6 illustrates a single-sided touch sensor in which the electrodes are located on a non-birefringent layer below the polarizer of an LCD display stack. Display stack 400 includes cover panel 410, polarizer 415, color filter glass 420, color filter 425, reference voltage layer 430, liquid crystal 435, conductive layer 440, rear glass 445, polarizer 450, backlight source 455, sense electrodes 465, drive electrodes 470, non-birefringent layer 480. One or more adhesive layers (e.g., OCA) may be used in display stack 100 to bind layers to one another. The depicted embodiment illustrates some adhesive layers, but not necessarily all, adhesive layers.

The layers of display stack 100 may be similar to the layers of display stack 100 depicted in FIG. 3. One difference may be the inclusion of an additional layer, non-birefringent layer 480. As mentioned in previous figures, in some embodiments, an additional layer may be added to the display stack to serve as the substrate for the touch sensor. In FIG. 6, display stack 400 includes non-birefringent layer 480. Non-birefringent layer 480 provides a substrate on which sense electrodes 465 and drive electrodes 470 may be located.

The electrodes may be deposited or laminated on non-birefringent layer 480. Because non-birefringent layer 480 is non-birefringent, it does not twist or otherwise re-polarize the already polarized light prior to passing through polarizer 415.

While FIGS. 3 through 6 have depicted various locations and configuration of touch sensor electrodes within different types of display stacks, one skilled in the art would appreciate that any configuration of touch sensors may be located in any suitable position within the display stack. Depending on the embodiment, the touch sensors may be deposited on, or laminated to, any suitable layer within a display stack. By way of example, and not by way of limitation, particular embodiments may comprise a touch sensor located under a linear and/or circular polarizer; a touch sensor located above the linear and/or circular polarizer; a touch sensor patterned on a linear and/or circular polarizer substrate; a touch sensor patterned under a linear and/or circular polarizer substrate; a touch sensor patterned on birefringent free material; a touch sensor patterned above and/or below a color filter layer; any of the above with a single sided sensor on one surface, where appropriate; any of the above with a dual sided sensor on both surfaces, where appropriate; any of the above with an AR layer; and/or any of the above with an AG layer. In certain embodiments, patterning the sensor on any optical component included within a display stack (e.g., polarizers, filters etc) may reduce the overall thickness of a touch screen and may increase transmissivity as there is no separate substrate for the touch sensor through which light must travel. In particular embodiments, in addition to reducing reflected light from the touch electrodes, reflected light from other internal surfaces may be reduced. This may increase the effective contrast ratio of the LCD to ambient light—making the LCD more visible in direct sunlight or conversely reducing the required intensity of light from the LCD for a given contrast ratio (power saving).

Moreover, if a non-birefringent substrate, or any other additional substrate for the touch sensor, is added to the display stack, such a layer may be deposited or formed anywhere within the display stack. By incorporating the touch sensor, in any of the various locations, within the display stack, the manufacturing process may be simplified and the overall thickness of a touch screen may be reduced. The reduction is particularly evident where one of the existing layers of a traditional display stack is used as the substrate for the touch sensor. Furthermore, in particular embodiments, by locating the touch sensor within the display stack, the touch screen may be free of air gaps. This may improve the image quality (e.g., improve the perceived contrast ratio) of a touch screen.

Although this disclosure describes a particular mechanical stack and particular display stacks with particular numbers of particular layers made of particular materials and having particular thicknesses, this disclosure contemplates any suitable mechanical stack and/or display with any suitable number of any suitable layers made of any suitable materials and having any suitable thicknesses.

Herein, reference to a computer-readable storage medium encompasses one or more non-transitory, tangible computer-readable storage media possessing structure. As an example and not by way of limitation, a computer-readable storage medium may include a semiconductor-based or other integrated circuit (IC) (such, as for example, a field-programmable gate array (FPGA) or an application-specific IC (ASIC)), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate. Herein, reference to a computer-readable storage medium excludes any medium that is not eligible for patent protection under 35 U.S.C. § 101. Herein, reference to a computer-readable storage medium excludes transitory forms of signal transmission (such as a propagating electrical or electromagnetic signal per se) to the extent that they are not eligible for patent protection under 35 U.S.C. § 101. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Particular features discussed with respect to particular embodiments may be combined or omitted from the features of other embodiments, where appropriate. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. An apparatus, comprising:
    a touch-sensitive screen comprising a plurality of layers, the plurality of layers comprising:
        a light emissive layer,
        a two-dimensional array of pixels configured to produce an image,
        a cathode layer, the cathode layer being configured to energize the light emissive layer,
        a substantially transparent cover layer,
        a first electrode layer comprising a plurality of first conductive electrodes,
        a second electrode layer comprising a plurality of second conductive electrodes; and
        a substrate;
        wherein the plurality of first conductive electrodes and the plurality of second conductive electrodes are substantially aligned with one or more gaps between two or more pixels of the two-dimensional array of pixels such that the plurality of first conductive electrodes and the plurality of second conductive electrodes do not cross over at least one of the pixels of the two-dimensional array of pixels;
        wherein the plurality of first conductive electrodes form vertices within the one or more gaps between two or more pixels of the two-dimensional array of pixels such that the vertices do not obscure in plan view at least one of the pixels of the two-dimensional array of pixels;
        wherein the plurality of first conductive electrodes and the plurality of second conductive electrodes are electrically connected to one or more tracks of conductive material on the substrate;
    a touch-sensor controller configured to detect and process the change in capacitance at one or more touch-sensor nodes to determine the presence and location of a touch-sensor input, and further configured to communicate information about the touch-sensor input to one or more components of the apparatus;
    a flexible printed circuit electrically connected to the touch-sensor controller; wherein the one or more tracks of conductive material on the substrate is electrically connected to the flexible printed circuit.

2. The apparatus of claim 1, the light emissive layer comprising an organic light emitting diode (OLED).

3. The apparatus of claim 2, wherein the first electrode layer comprising a plurality of first conductive electrodes and the second electrode layer comprising a plurality of second conductive electrodes are in contact with a same layer.

4. The apparatus of claim 2, wherein the plurality of first conductive electrodes and the second conductive electrodes are formed on the same layer.

5. The apparatus of claim 2, the two-dimensional array of pixels comprising one or more layers.

6. The apparatus of claim 1, wherein the plurality of first conductive electrodes and the second conductive electrodes are configured to capacitively couple across a dielectric material.

7. The apparatus of claim 6, the dielectric material comprising a non-birefringent material.

8. The apparatus of claim 1, the plurality of first conductive electrodes comprising non-linear conductive lines configured to reduce the probability of causing interference or moiré patterns.

9. The apparatus of claim 8, the non-linear conductive lines comprising substantially sinusoidal shapes.

10. The apparatus of claim 2, wherein the plurality of first conductive electrodes form an array of diamond-shaped cells.

11. An apparatus, comprising:
    a touch-sensitive screen comprising a plurality of layers, the plurality of layers comprising:
        a light emissive layer,
        a two-dimensional array of pixels configured to produce an image,
        a cathode layer, the cathode layer being configured to energize the light emissive layer,
        a substantially transparent cover layer,
        a first electrode layer comprising a plurality of first conductive electrodes forming a first mesh pattern,
        a second electrode layer comprising a plurality of second conductive electrodes forming a second mesh pattern; and
        a substrate;
        wherein the plurality of first conductive electrodes is substantially aligned with one or more gaps between two or more pixels of the two-dimensional array of pixels such that the plurality of first conductive electrodes does not cross over at least one of the pixels of the two-dimensional array of pixels;
        wherein the plurality of first conductive electrodes form vertices within the one or more gaps between two or more pixels of the two-dimensional array of pixels such that the vertices do not obscure in plan view at least one of the pixels of the two-dimensional array of pixels;
        wherein the plurality of first conductive electrodes and the plurality of second conductive electrodes are electrically connected to one or more tracks of conductive material on the substrate;
    a touch-sensor controller configured to detect and process the change in capacitance at one or more touch-sensor nodes to determine the presence and location of a touch-sensor input, and further configured to communicate information about the touch-sensor input to one or more components of the apparatus;

a flexible printed circuit electrically connected to the touch-sensor controller;

wherein the one or more tracks of conductive material on the substrate is electrically connected to the flexible printed circuit.

12. The apparatus of claim 11, the light emissive layer comprising an organic light emitting diode (OLED).

13. The apparatus of claim 12, wherein the first electrode layer comprising a plurality of first conductive electrodes forming a mesh pattern and the second electrode layer comprising a plurality of second conductive electrodes forming a mesh pattern are in contact with a same layer.

14. The apparatus of claim 12, wherein the plurality of first conductive electrodes and the second conductive electrodes are formed on a same layer.

15. The apparatus of claim 12, the two-dimensional array of pixels comprising one or more layers.

16. The apparatus of claim 11, wherein the plurality of first conductive electrodes and the second conductive electrodes are configured to capacitively couple across a dielectric material.

17. The apparatus of claim 16, the dielectric material comprising a non-birefringent material.

18. The apparatus of claim 11, the plurality of first conductive electrodes comprising non-linear conductive lines configured to reduce the probability of causing interference or moiré patterns.

19. The apparatus of claim 11, wherein the first mesh pattern and the second mesh pattern are not identical.

20. The apparatus of claim 12, wherein the plurality of first conductive electrodes form an array of diamond-shaped mesh cells.

* * * * *